United States Patent [19]

Matsui et al.

[11] Patent Number: 5,719,537
[45] Date of Patent: Feb. 17, 1998

[54] SURFACE ACOUSTIC WAVE FILTER WITH RANGE OF A FREQUENCY DIFFERENCE BETWEEN RESONANCE FREQUENCIES OF SERIES AND PARALLEL RESONATORS

[75] Inventors: Kuniyuki Matsui; Yasuhiro Hirao, both of Hirakata; Yasumi Kobayashi, Yawata; Kosuke Takeuchi, Hirakata; Kenichi Shibata, Hashimoto; Masami Ikeda, Osaka; Toshiharu Tanaka, Higashiosaka; Yasutaka Shimizu, 3-1-10, Umeoka, Setagayak-ku, Tokyo, all of Japan

[73] Assignees: Sanyo Electric Co., Ltd.; Yasutaka Shimizu, both of Tokyo, Japan

[21] Appl. No.: 629,799

[22] Filed: Apr. 9, 1996

[30] Foreign Application Priority Data

Apr. 10, 1995 [JP] Japan ................ 7-109980

[51] Int. Cl.[6] ........................... H03H 9/64
[52] U.S. Cl. .............. 333/193; 310/313 A; 310/313 R
[58] Field of Search ........................ 333/193–196; 310/313 R–313 D

[56] References Cited

U.S. PATENT DOCUMENTS

| | | | |
|---|---|---|---|
| 4,387,355 | 6/1983 | Uno et al. | 333/196 |
| 4,672,255 | 6/1987 | Suzuki et al. | 310/313 A |
| 4,803,449 | 2/1989 | Hikita et al. | 333/196 |
| 5,115,216 | 5/1992 | Hikita et al. | 333/195 |
| 5,471,178 | 11/1995 | Hickernell | 333/193 |
| 5,506,552 | 4/1996 | Seki et al. | 333/194 |
| 5,559,481 | 9/1996 | Satoh et al. | 333/193 |

FOREIGN PATENT DOCUMENTS

| | | |
|---|---|---|
| 5-183380 | 7/1993 | Japan . |
| 6-69750 | 3/1994 | Japan . |

*Primary Examiner*—Robert Pascal
*Assistant Examiner*—Barbara Summons
*Attorney, Agent, or Firm*—Armstrong, Westerman, Hattori, McLeland & Naughton

[57] ABSTRACT

In a resonator-type surface acoustic wave filter comprising a lithium tantalate substrate, lithium niobate substrate or lithium tetraborate substrate having a cut plane of high velocity, the direction of propagation of surface acoustic waves is set within the range of (40 deg to 90 deg, 40 deg to 90 deg, 0 deg to 60 deg) as expressed in Eulerian angles, and the frequency difference $\Delta f$ between the resonance frequency frs of series resonators and the resonance frequency frp of parallel resonators is set within a predetermined range formulated with the center frequency, the capacitance Cos of the series resonators and the capacitance Cop of the parallel resonators taken as parameters. Optimum ranges of the required design parameters are thus clarified to assure the resonator-type surface acoustic wave filter of higher performance.

3 Claims, 6 Drawing Sheets

5,719,537

1

SURFACE ACOUSTIC WAVE FILTER WITH RANGE OF A FREQUENCY DIFFERENCE BETWEEN RESONANCE FREQUENCIES OF SERIES AND PARALLEL RESONATORS

FIELD OF THE INVENTION

The present invention relates to resonator-type surface acoustic wave filters comprising surface acoustic wave resonators connected respectively in series and in parallel with a signal line.

BACKGROUND OF THE INVENTION

In recent years, surface acoustic wave devices have found wide application in communication devices such as motor vehicle telephones as circuits elements of resonator filters, signal processing delay lines, etc. For example, FIG. 9 shows a surface acoustic wave device comprising interdigital electrodes 2 and latticelike reflectors 3, 3 which are formed on the surface of a piezoelectric substrate 1, and serving as a resonator.

Further as shown in FIG. 8, a filter can be composed of resonators 6, 7 connected respectively to a series line 4 and parallel line 5 of a ladder-type circuit. Such surface acoustic wave filters of the resonator-type are in wide use because of the advantages of being low in insertion loss and requiring no matching circuit.

With resonator-type surface acoustic wave filters, the resonance frequency frs of the series resonator 6 is made to substantially match the antiresonance frequency fap of the parallel resonator 7 to thereby realize band pass filter characteristics.

The parameters in designing resonator-type surface acoustic wave filters include the difference Δf between the resonance frequency frs of series resonators and the resonance frequency frp of parallel resonators (Δf=frs−frp), and the capacitance Cos or Cop determined from the number of pairs of electrodes of each resonator and the aperture width thereof. Optimum ranges of design parameters are clarified for substrates (36° Y-X LitaO$_3$, 64° Y-X LiNbO$_3$ and 41° Y-X LiNbO$_3$) conventionally used for surface acoustic wave filters (JP-A-183380/1993, -69750/1994, etc.).

Incidentally, for use in surface acoustic wave filters adapted for higher frequencies in recent years, research has been conducted on cut planes for obtaining higher acoustic velocities, with the result that cut planes of higher velocity than conventionally are discovered for lithium tantalate (LiTaO$_3$), lithium niobate (LiNbO$_3$) and lithium tetraborate (Li$_2$B$_4$O$_7$).

The direction of propagation of surface acoustic waves as expressed in terms of Eulerian angles is (90°, 90°, 31°) on lithium tantalate, the direction of propagation of surface acoustic waves in Eulerian angles is (90°, 90°, 37°) on lithium niobate, and the direction of propagation of surface acoustic waves in Eulerian angles is (0°, 45°, 90°) on lithium tetraborate.

Nevertheless, optimum ranges of design parameters still remain to be clarified for resonator-type surface acoustic wave filters including a lithium tantalate substrate, lithium niobate substrate or lithium tetraborate substrate having such a cut plane.

SUMMARY OF THE INVENTION

In resonator-type surface acoustic wave filters comprising a lithium tantalate substrate, lithium niobate substrate or lithium tetraborate substrate having a cut plane of high velocity, an object of the present invention is to determine optimum ranges of required design parameters, especially those of the resonance frequencies of series resonators and parallel resonators, and to thereby assure the resonator-type surface acoustic wave filter of higher performance.

The present invention uses the ripple and insertion loss in the characteristics of the surface acoustic wave filter in the pass band as first index for determining the performance of the filter, and the voltage standing wave ratio (VSWR) representing the state of matching as a second index.

In connection with the difference Δf between the resonance frequency frs of series resonators and the resonance frequency frp of parallel resonators (the difference will hereinafter be referred to merely as the "resonance frequency difference") in the case of resonator-type surface acoustic wave filters, it is known that the greater the difference, the greater is the ripple A in the characteristics in the pass band, and that the smaller the difference, the greater is the insertion loss B as shown in FIG. 10.

In connection with the capacitance Cos of series resonators and the capacitance Cop of parallel resonators, on the other hand, it is known that variations in these values result in variations in VSWR.

In designing the filter, it is generally desired to limit the ripple A to not greater than 2.0 dB, the insertion loss B to not greater than 5.0 dB and VSWR to a value up to 2.0.

Accordingly, the present invention clarifies an optimum range of resonance frequency differences Δf wherein the ripple and insertion loss can be limited to not greater than the above-mentioned limit values, and further clarifies optimum ranges of capacitances Cos and Cop of series resonators and parallel resonators wherein the value of VSWR can be reduced to not greater than the above-mentioned limit value, based on the results of experiments conducted on many experimental devices prepared with various design parameters given thereto.

More specifically, in a surface acoustic wave filter wherein a lithium tantalate substrate is used, the direction of propagation of surface acoustic waves is set within (40 deg to 90 deg, 40 deg to 90 deg, 0 deg to 60 deg) as expressed in Eulerian angles and within a range equivalent thereto, and the resonance frequency difference Δf is set within a range defined by Mathematical Expression 1 given below, with the center frequency f$_0$ and the capacitance ratio P taken as parameters.

Mathematical Expression 1

$$\Delta f_{min} \leq \Delta f \leq \Delta f_{max}$$

where $\Delta f = frs - frp$
$\Delta f_{min} = (-0.00158 + 0.0116P - 0.00421P^2) \times f_0$
$\Delta f_{max} = (0.0778 - 0.0736P + 0.0252P^2) \times f_0$
$P = Cop/Cos$ Further more specifically, the capacitance Cos of the series resonators and the capacitance Cop of the parallel resonators are set within a striplike range defined by Mathematical Expression 2 given below.

Mathematical Expression 2

$$Cop = -0.49Cos + (4978 \pm 2850)/f_0$$

In a surface acoustic wave filter wherein a lithium niobate substrate is used, the direction of propagation of surface acoustic waves is set within (40 deg to 90 deg, 40 deg to 90 deg, 0 deg to 60 deg) as expressed in Eulerian angles and within a range equivalent thereto, and the resonance frequency difference Δf is set within a range defined by Mathematical Expression 3 given below, with the center frequency f0 and the capacitance ratio P taken as parameters.
Mathematical Expression 3

$$\Delta f_{min} \leq \Delta f \leq \Delta f_{max}$$

where $$\Delta f = f_{rs} - f_{rp}$$
$$\Delta f_{min} = (0.0262 + 0.0245P - 0.0021P^2) \times f_0$$
$$\Delta f_{max} = (0.303 - 0.269P + 0.082P^2) \times f_0$$
$$P = Cop/Cos$$

Further more specifically, the capacitance Cos of the series resonators and the capacitance Cop of the parallel resonators are set within a striplike range defined by Mathematical Expression 4 given below.
Mathematical Expression 4

$$Cop = -0.93Cos + (3895 \pm 1425)/f_0$$

In a surface acoustic wave filter wherein a lithium tetraborate substrate is used, the direction of propagation of surface acoustic waves is set within (0 deg to 50 deg, 15 deg to 75 deg, 40 deg to 90 deg) as expressed in Eulerian angles and within a range equivalent thereto, and the resonance frequency difference Δf is set within a range defined by Mathematical Expression 5 given below, with the center frequency $f_0$ and the capacitance ratio P taken as parameters.
Mathematical Expression 5

$$\Delta f_{min} \leq \Delta f \leq \Delta f_{max}$$

where $$\Delta f = f_{rs} - f_{rp}$$
$$\Delta f_{min} = (-0.00002 + 0.00642P - 0.0021P^2) \times f_0$$
$$\Delta f_{max} = (0.0305 - 0.0161P + 0.0021P^2) \times f_0$$
$$P = Cop/Cos$$

Further more specifically, the capacitance Cos of the series resonators and the capacitance Cop of the parallel resonators are set within a striplike range defined in Mathematical Expression 6 given below.
Mathematical Expression 6

$$Cop = -0.47Cos + (3078 \pm 912)/f_0$$

In designing a surface acoustic wave filter, the specifications of the required filter provide the center frequency $f_0$ and attenuation out of the pass band, and the capacitance ratio P is determined in accordance with the attenuation.

The center frequency $f_0$ and the capacitance ratio P obtained are then substituted in Mathematical Expression 1, 3 or 5 to calculate an optimum range (Δfmin to Δfmax) of resonance frequency difference Δf in conformity with the material of the substrate, and the resonance frequency difference Δf is determined as a value within this range.

Next, the resonance frequency frs of series resonators is determined as a value around the center frequency $f_0$ (frs is approximately equal to $f_0$). The resonance frequency frp (=frs−Δf) can then be determined from the resonance frequency difference Δf determined.

Series resonators and parallel resonators are designed based on the series resonator resonance frequency frs and the parallel resonator resonance frequency frp thus obtained, whereby the ripple can be reduced to not greater than 2.0 dB, with the insertion loss reduced to not greater than 5.0 dB at the same time.

Further the values of capacitance Cos of the series resonators and of capacitance Cop of the parallel resonators are determined which values satisfy the capacitance ratio P determined and are to be included within the striplike range defined by Mathematical Expression 2, 4 or 6 given above.

VSWR can be limited to not greater than 2.0 by designing the series resonators and parallel resonators based on the series resonator capacitance Cos and parallel resonator capacitance Cop thus obtained.

In the resonator-type surface acoustic wave filter comprising a lithium tantalate substrate, lithium niobate substrate or lithium tetraborate substrate having a cut plane of high velocity, the resonance frequencies of the series resonators and parallel resonators are sent in an optimum range according to the present invention to thereby reduce the ripple and insertion loss at the same time.

DETAILED DESCRIPTION OF EMBODIMENTS

Figure 8:
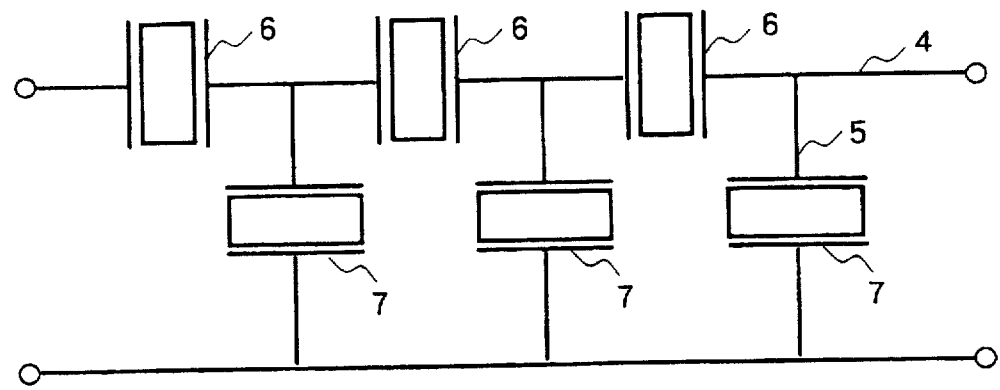
FIG. 8 is a diagram showing the basic construction of a resonator-type surface acoustic wave filter.
Figure 9:
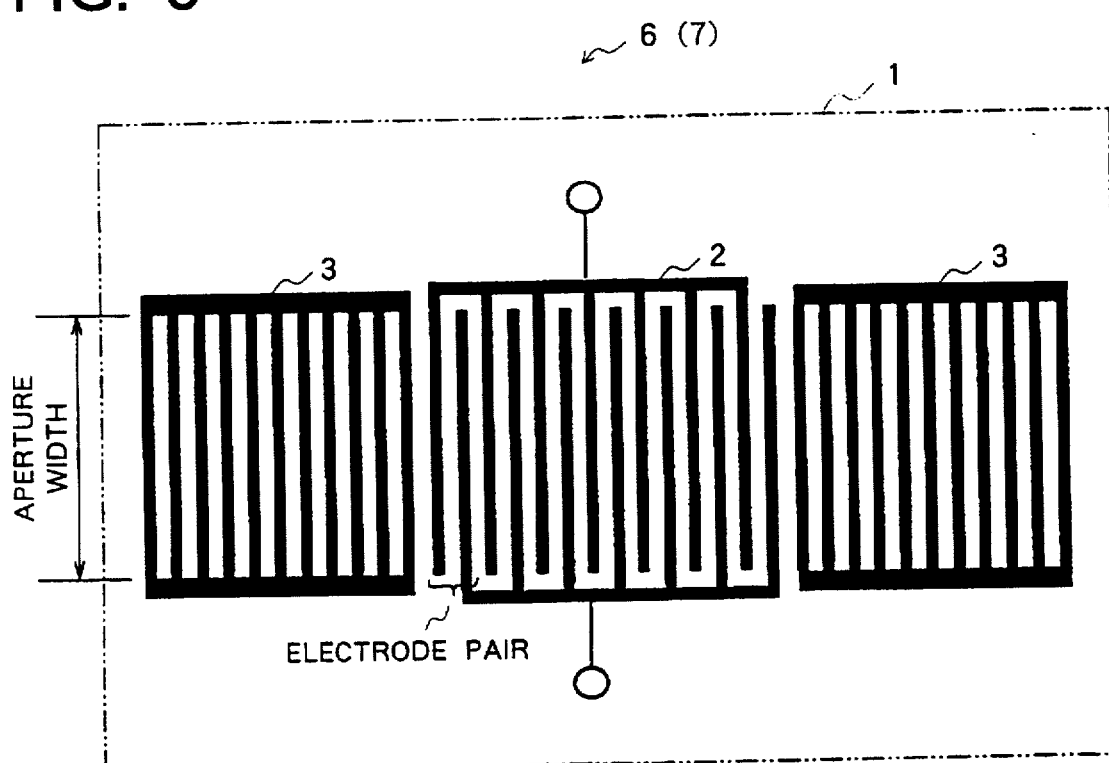
FIG. 9 is a diagram showing the construction of electrodes in a one-port resonator.

FIG. 8 shows a surface acoustic wave filter of the resonator-type embodying the present invention and comprising one-port resonators 6, 7 connected respectively to a series line 4 and parallel lines 5 of a ladder-type circuit, as shown in FIG. 9, each of the one-port resonators 6, 7 comprises interdigital electrodes 2 and latticelike reflectors 3, 3 which are formed on a substrate 1.

On a lithium tantalate substrate, the electrodes are so formed that the direction of propagation of surface acoustic waves is in the range of (40 deg to 90 deg, 40 deg to 90 deg, 0 deg to 60 deg), preferably (90 deg, 90 deg, 31 deg), as expressed in Eulerian angles. Further on a lithium niobate substrate, the electrodes are so formed that the direction of propagation of surface acoustic waves is in the range of (40 deg to 90 deg, 40 deg to 90 deg, 0 deg to 60 deg), preferably (90 deg, 90 deg, 37 deg), as expressed in Eulerian angles. Further on a lithium tetraborate substrate, the electrodes are so formed that the direction of propagation of surface acoustic waves is in the range of (0 deg to 50 deg, 15 deg to 75 deg, 40 deg to 90 deg), preferably (0 deg, 45 deg, 90 deg), as expressed in Eulerian angles. This affords supersonic surface acoustic waves (quasi-surface acoustic waves wherein the longitudinal wave component predominates over the transverse wave component).

According to the present embodiment, an optimum range of resonance frequency differences $\Delta f$ for reducing the ripple to not greater than 2.0 dB and the insertion loss to not greater than 5.0 dB was determined first by experiments using experimental devices.

Figure 1:
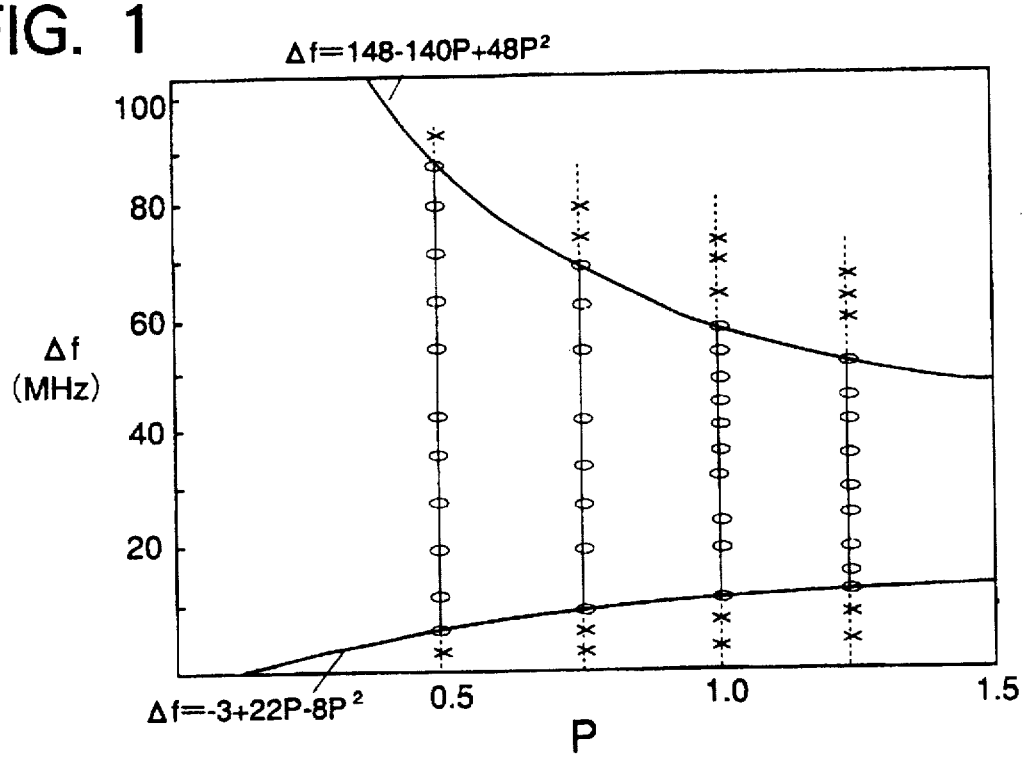
FIG. 1 is a graph wherein the capacitance ratio P is plotted as abscissa and the resonance frequency difference Δf as ordinate to show the acceptability of conditions for the ripple and insertion loss and limits thereof in surface acoustic wave filters wherein a lithium tantalate substrate is used.

FIG. 1 shows the result of an experiment conducted on resonator-type surface acoustic wave filters comprising a lithium tantalate substrate and having a center frequency of 1.9 GHz, using experimental devices. More specifically, FIG. 1 is a graph wherein the capacitance ratio P is plotted as abscissa, and the resonance frequency difference $\Delta f$ as ordinate. Experimental devices gradually varying in these values were checked for ripple and insertion loss, and the devices fulfilling the requirements of up to 2.0 dB in ripple and up to 5.0 dB in insertion loss are represented by the mark o, and the other devices by the mark x. The optimum $\Delta f$ (MHz) range satisfying these requirements is $6 \leq \Delta f \leq 90$ for P=0.5, $9 \leq \Delta f \leq 70$ for P=0.75, $11 \leq \Delta f \leq 56$ for P=1.0, and $12 \leq \Delta f \leq 48$ for P=1.25. The upper curve in the graph of FIG. 1 represents the limits as to the ripple, and the lower curve the limit as to the insertion loss.

Mathematical Expression 7 given below and representing the optimum range of resonance frequency differences $\Delta f$ is obtained by applying least squares to these upper limit values and lower limit values.
Mathematical Expression 7

$$-3+22P-8P^2 \leq \Delta f \leq 148-140P+48P^2$$

Furthermore, normalization of Mathematical Expression 7 with the center frequency $f_0$ (MHz) affords Mathematical Expression 8 given below.
Mathematical Expression 8

$$\Delta fmin \leq \Delta f \leq \Delta fmax$$

where $$\Delta fmin = (-0.00158 + 0.0116P - 0.00421P^2) \times f_0$$

$$\Delta fmax = (0.0778 - 0.0736P + 0.0252P^2) \times f_0$$

Figure 2:
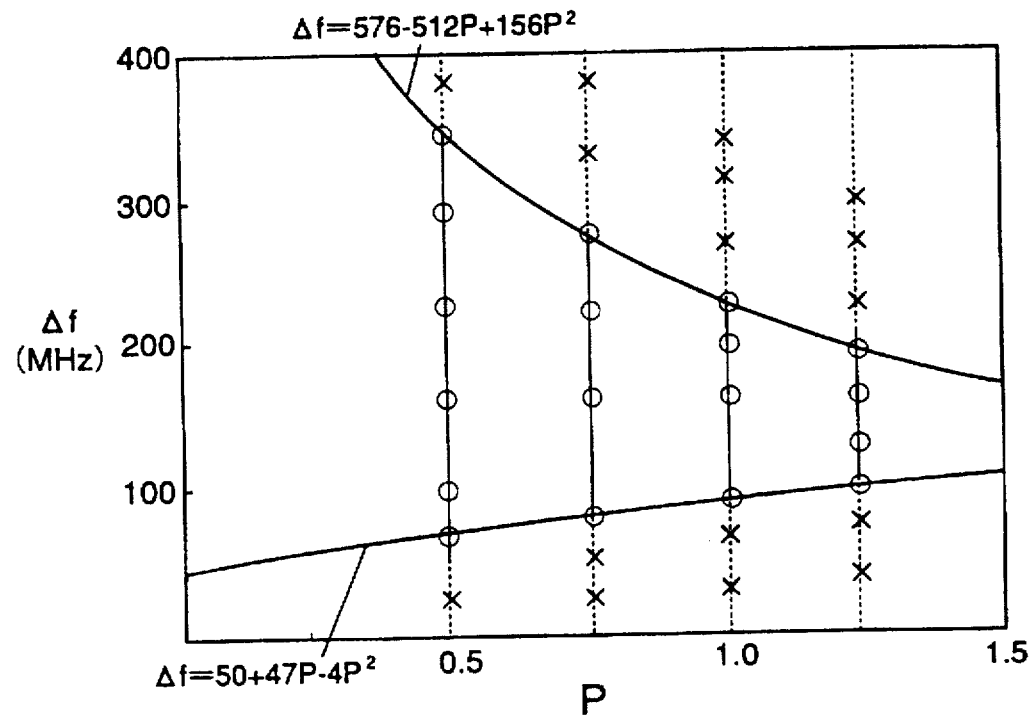
FIG. 2 is a graph showing the same in the case of surface acoustic wave filters wherein a lithium niobate substrate is used.

Like FIG. 1, FIG. 2 shows the result of an experiment conducted on resonator-type surface acoustic wave filters comprising a lithium niobate substrate and having a center frequency of 1.9 GHz, using experimental devices. The optimum $\Delta f$ (MHz) range satisfying the requirements of up to 2.0 dB in ripple and up to 5.0 dB in insertion loss is $72 \leq \Delta f \leq 359$ for P=0.5, $83 \leq \Delta f \leq 280$ for P=0.75, $92 \leq \Delta f \leq 220$ for P=1.0, and $102 \leq \Delta f \leq 180$ for P=1.25.

Accordingly, Mathematical Expression 9 given below and representing the optimum range of resonance frequency difference $\Delta f$ is obtained by applying least squares to these upper limit values and lower limit values.
Mathematical Expression 9

$$50+47P-4P^2 \leq \Delta f \leq 576-512P+156P^2$$

Furthermore, Mathematical Expression 9 given above, when normalized with the center frequency $f_0$ (MHz), affords Mathematical Expression 10 given below.
Mathematical Expression 10

$$\Delta fmin \leq \Delta f \leq \Delta fmax$$

where $$\Delta fmin = (0.0262 + 0.0245P - 0.0021P^2) \times f_0$$

$$\Delta fmax = (0.303 - 0.269P + 0.082P^2) \times f_0$$

Figure 3:
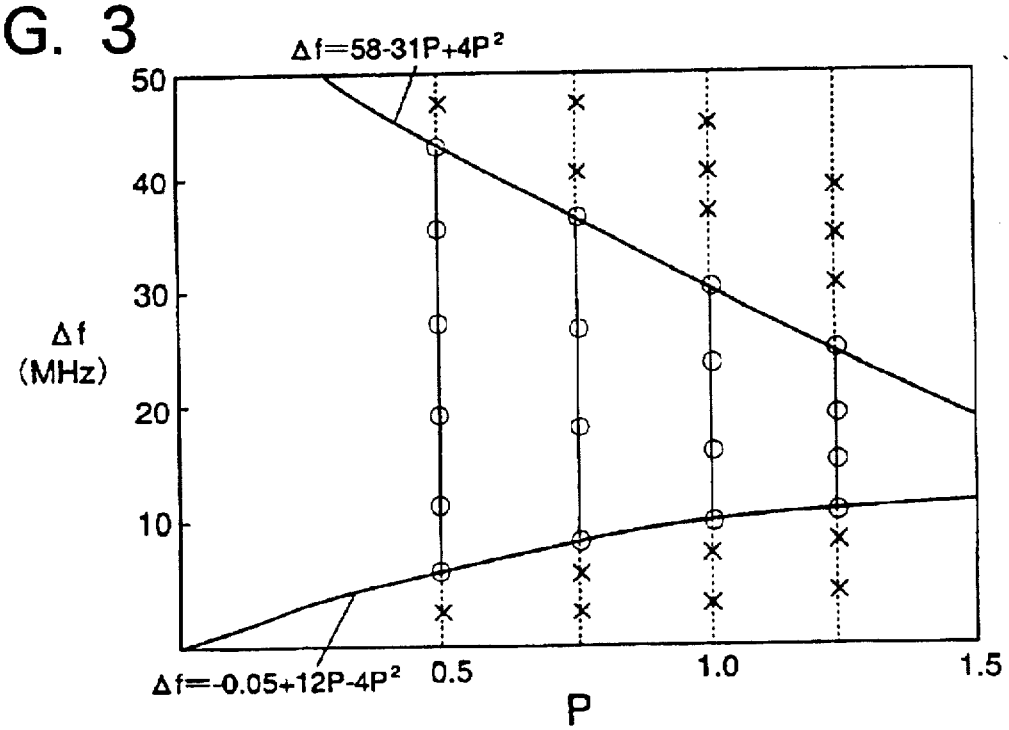
FIG. 3 is a graph showing the same in the case of surface acoustic wave filters wherein a lithium tetraborate substrate is used.

Like FIG. 1, FIG. 3 shows the result of an experiment conducted on resonator-type surface acoustic wave filters comprising a lithium tetraborate substrate and having a center frequency of 1.9 GHz, using experimental devices. The optimum $\Delta f$ (MHz) range satisfying the requirement of up to 2.0 dB in ripple and up to 5.0 dB in insertion loss is $5 \leq \Delta f \leq 45$ for P=0.5, $7 \leq \Delta f \leq 37$ for P=0.75, $8 \leq \Delta f \leq 32$ for P=1.0, and $9 \leq \Delta f \leq 26$ for P=1.25.

Accordingly, Mathematical Expression 11 given below and representing the optimum range of resonance frequency differences $\Delta f$ is obtained by applying least squares to these upper limit values and lower limit values.
Mathematical Expression 11

$$-0.05+12P-4P^2 \leq \Delta f \leq 58-31P+4P^2$$

Furthermore, Mathematical Expression 11, when normalized with the center frequency $f_0$ (MHz), affords Mathematical Expression 12 given below.
Mathematical Expression 12

$$\Delta fmin \leq \Delta f \leq \Delta fmax$$

where $$\Delta fmin = (-0.00002 + 0.00642P - 0.0021P^2) \times f_0$$

$$\Delta fmax = (0.0305 - 0.0161P + 0.0021P^2) \times f_0$$

According to the present embodiment, an optimum range of the capacitances Cos and Cop of the series resonators and parallel resonators for limiting VSWR to not greater than 2.0 was determined next.

Figure 4:
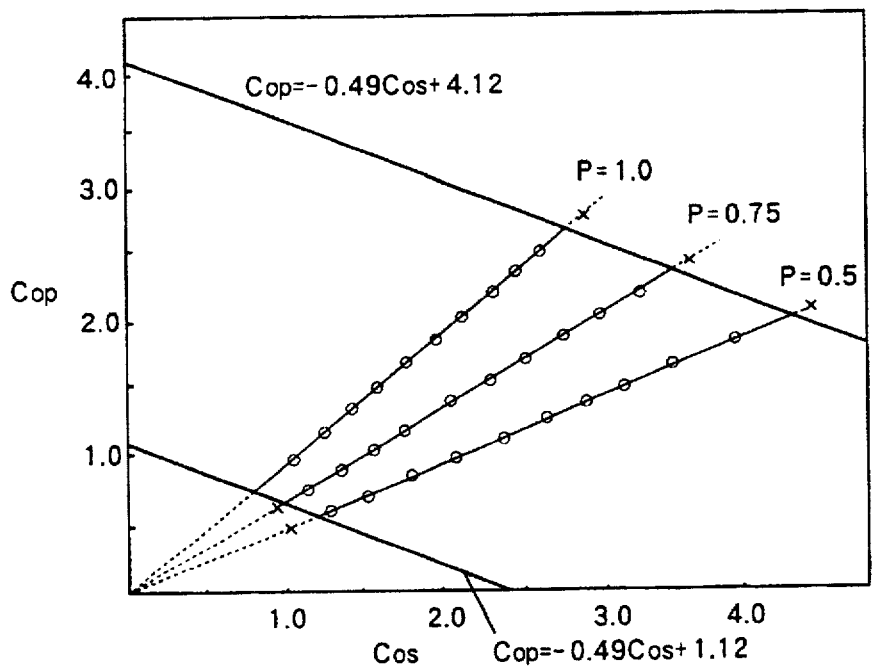
FIG. 4 is a graph wherein the capacitance Cos of series resonators is plotted as abscissa and the capacitance Cop of parallel resonators as ordinate to show the acceptability of conditions for VSWR and limits thereof in surface acoustic wave filters wherein a lithium tantalate substrate is used.

FIG. 4 shows the result of an experiment conducted on resonator-type surface acoustic wave filters comprising a lithium tantalate substrate and having a center frequency of 1.9 GHz, using experimental devices. More specifically, FIG. 4 is a graph wherein the capacitance Cos (pF) of the series resonators is plotted as abscissa, and the capacitance Cop (pF) of the parallel resonators as ordinate. Experimental devices gradually varying in these values were checked for VSWR, and the devices fulfilling the requirement of up to 2.0 in the measurement are represented by the mark o, and the other devices by the mark x.

The capacitances Cos and Cop (pF) can be calculated from Mathematical Expression 13 given below wherein N is the number of electrode pairs, and W ($\mu$m) is the aperture width shown in FIG. 9.
Mathematical Expression 13

$$C = 4 \times 10^{-4} \times N \times W$$

As illustrated, the experimental devices fulfilling the above requirement are present in a striplike region indicated in solid lines in the graph, and the striplike range can be expressed by Mathematical Expression 14 given below.
Mathematical Expression 14

$$Cop = -0.49Cos + 2.62 \pm 1.5$$

Furthermore, normalization of Mathematical Expression 14 given above with the center frequency $f_0$ (MHz) affords Mathematical Expression 15 given below.

Mathematical Expression 15

$$Cop=-0.49Cos+(4978\pm2850)/f_0$$

Figure 5:
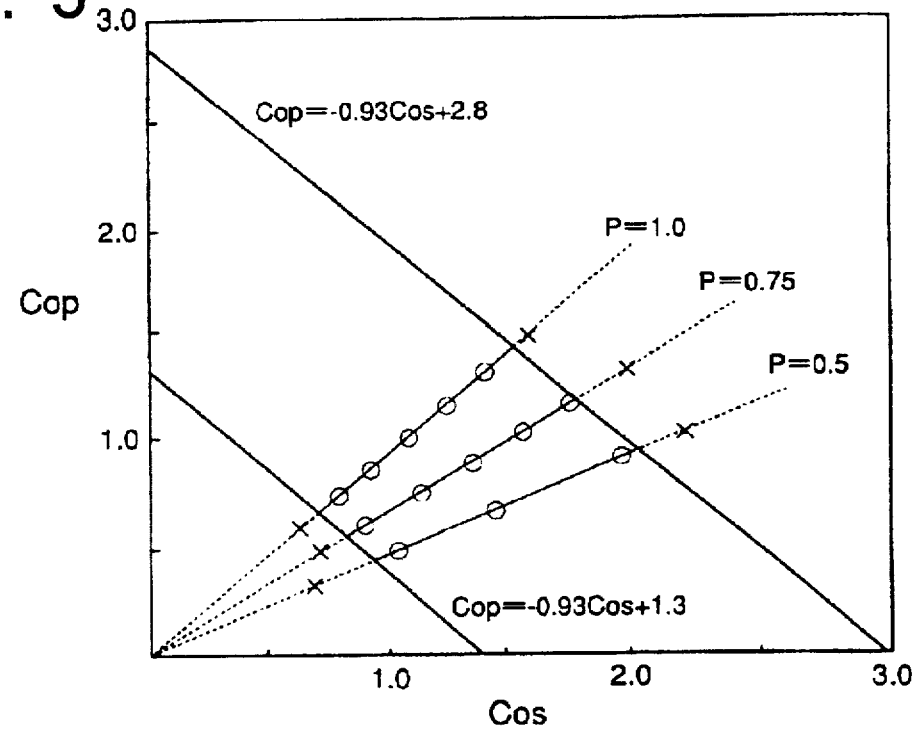
FIG. 5 is a graph showing the same in the case of surface acoustic wave filters wherein a lithium niobate substrate is used.

Like FIG. 4, FIG. 5 shows the result of an experiment conducted on resonator-type surface acoustic wave filters comprising a lithium niobate substrate and having a center frequency of 1.9 GHz, using experimental devices. The devices fulfilling the requirement of up to 2.0 in VSWR measurement are present in a striplike region indicated in solid lines in the graph, and the striplike range can be expressed by Mathematical Expression 16 given below.

Mathematical Expression 16

$$Cop=-0.93Cos+2.05\pm0.75$$

Furthermore, Mathematical Expression 16 given above, when normalized with the center frequency $f_0$ (MHz), affords Mathematical Expression 17 given below.

Mathematical Expression 17

$$Cop=-0.93Cos+(3895\pm1425)/f_0$$

Figure 6:
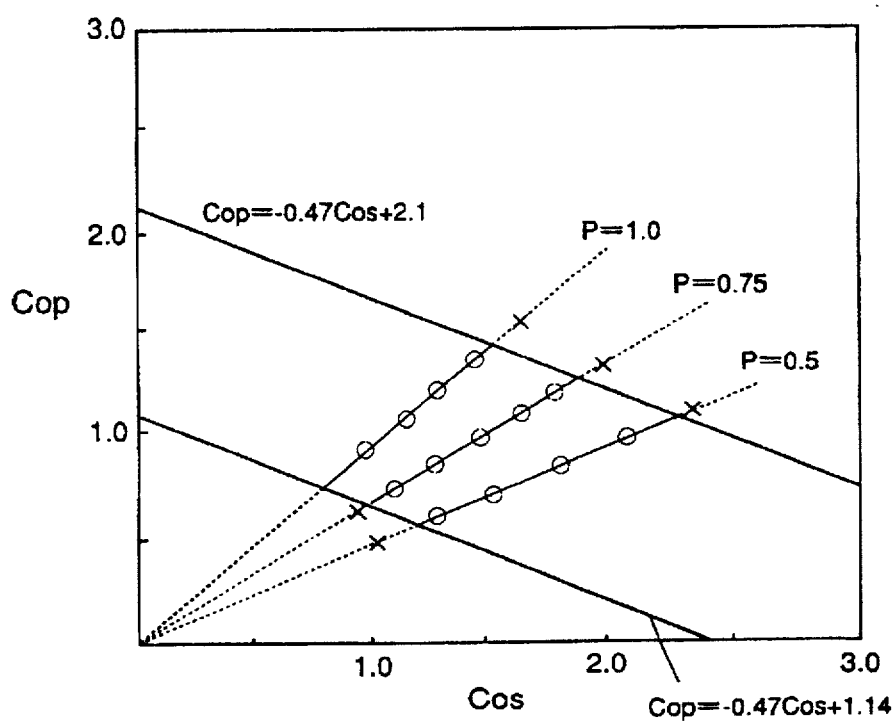
FIG. 6 is a graph showing the same in the case of surface acoustic wave filters wherein a lithium tetraborate substrate is used.

Like FIG. 4, FIG. 6 shows the result of an experiment conducted on resonator-type surface acoustic wave filters comprising a lithium tetraborate substrate and having a center frequency of 1.9 GHz, using experimental devices. The devices fulfilling the requirement of up to 2.0 in VSWR measurement are present in a striplike region indicated in solid lines in the graph, and the striplike range can be expressed by Mathematical Expression 18 given below.

Mathematical Expression 18

$$Cop=-0.47Cos+1.62\pm0.48$$

Furthermore, Mathematical Expression 18 given above, when normalized with the center frequency $f_0$ (MHz), affords Mathematical Expression 19 given below.

Mathematical Expression 19

$$Cop=-0.47Cos+(3078\pm912)/f_0$$

Accordingly, the ripple in the pass-band characteristics is limited to not greater than 2.0 dB with the insertion loss limited to not greater than 5.0 dB at the same time, by determining the resonance frequency difference $\Delta f$ as a value within the range defined by Mathematical Expression 8, 10 or 12 given above in accordance with the material of the substrate.

Furthermore, the capacitances of the series resonators and the parallel resonators are set within the striplike range defined by Mathematical Expression 15, 17 or 19 given above, whereby VSWR is limited to not greater than 2.0.

Figure 7:
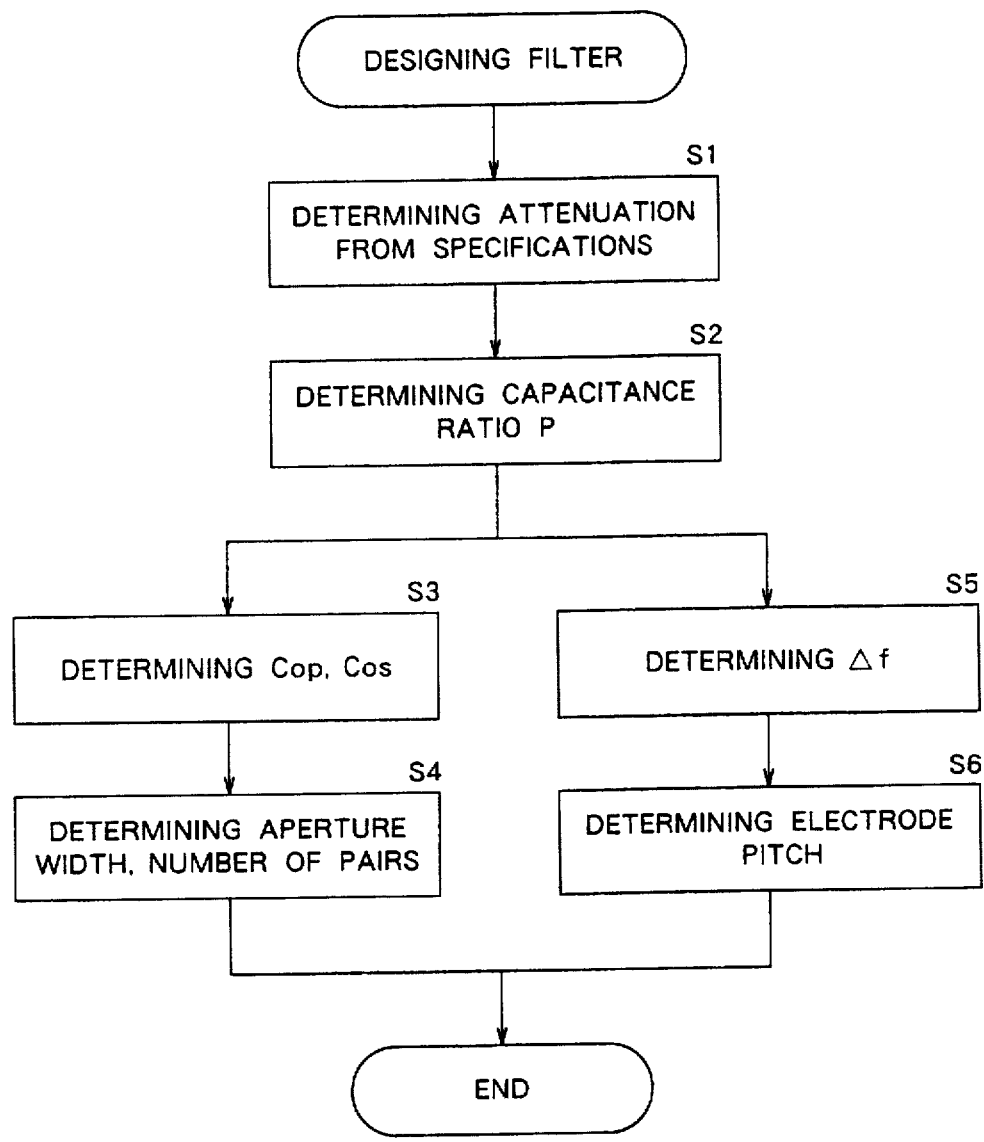
FIG. 7 is a flow chart showing a procedure for designing a surface acoustic wave filter embodying the present invention.

FIG. 7 shows a procedure for actually designing a resonator-type surface acoustic wave filter based on the foregoing design parameter determining methods.

Figure 10:
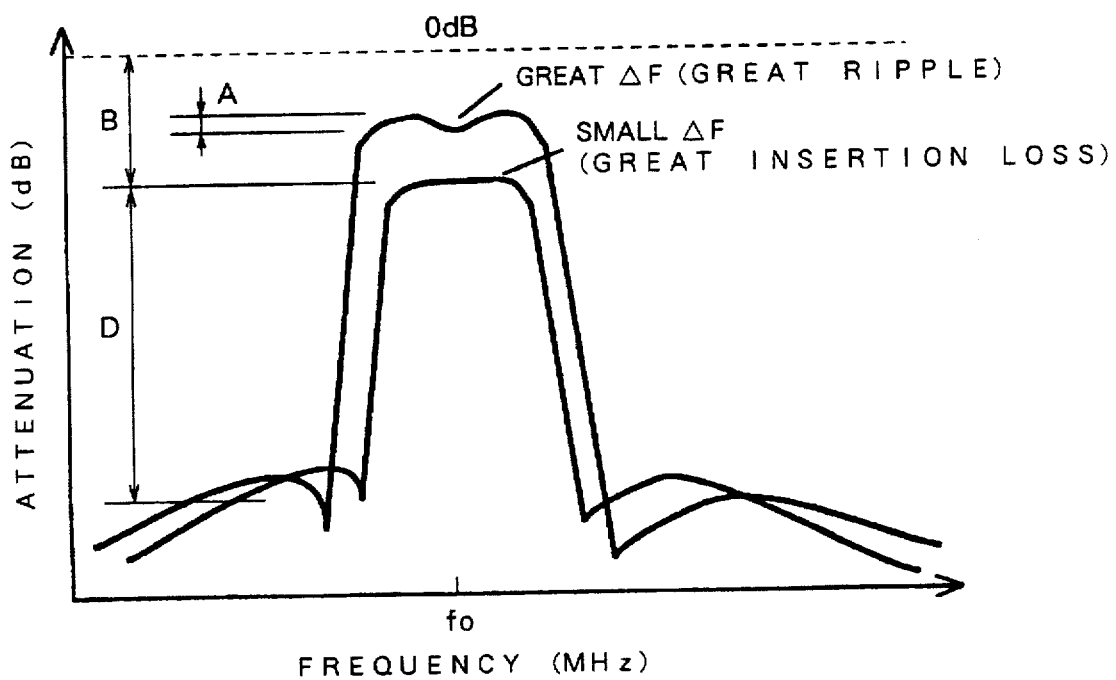
FIG. 10 is a graph for illustrating the relationship between the resonance frequency difference Δf and the ripple and insertion loss.

First in step S1, the center frequency $f_0$ and attenuation out of the pass band D are determined based on the specifications of the filter required (see FIG. 10). Next in step S2, the capacitance ratio P (e.g., 0.75) is determined according to the attenuation out of the pass band (e.g., 20 dB) thus determined, from the relationship already clarified (e.g., linear relationship) between the attenuation out of the pass band and the capacitance ratio.

Subsequently in step S3, values of series resonator capacitance Cos and of parallel resonator capacitance Cop are determined which satisfy the capacitance ratio P determined and which are to be included in the striplike range defined by Mathematical Expression 15, 17 or 19 given above. For example from FIG. 4, Cop=1.2 and Cos=1.6 can be determined when P=0.75.

The aperture width W of electrodes and the number N of pairs thereof are thereafter determined from Mathematical Expression 13 given above in step S4. For example, W=80μm and N=38 are obtained from Cop=1.2 for the parallel line, and W=40 μm and N=100 from Cos=1.6 for the series line.

On the other hand, the resonance frequency difference $\Delta f$ is determined in step S5 from the center frequency $f_0$ and capacitance ratio P determined, using Mathematical Expression 8, 10 or 12 given above. For example, $\Delta f$=30 MHz is obtained from FIG. 1 when P=0.75.

The electrode pitch is subsequently determined in step S6. At this time, the resonance frequency frs of the series resonators (approximately equal to $f_0$) is determined as a value around the center frequency $f_0$, and the resonance frequency frp (=frs-$\Delta f$) of the parallel resonators is determined from the resonance frequency difference $\Delta f$. Then determined from these resonance frequency values are the electrode pitch, electrode width and spacing between the electrodes for the series resonators and parallel resonators.

The procedure described makes it possible to readily design surface acoustic wave filters of high performance which are reduced to not greater than 2.0 dB in ripple, to not greater than 5.0 dB in insertion loss and to not greater than 2.0 in VSWR at the same time.

The embodiments described are intended to illustrate the present invention and should not be construed as limiting the invention defined in appended claims or reducing the scope thereof. Further the devices of the invention are not limited to the foregoing embodiments in construction but can of course be modified variously without departing from the sprit of the invention as defined in the claims.

What is claimed is:

1. A surface acoustic wave filter which comprises surface acoustic wave resonators connected respectively in series and in parallel with a signal line and each having exciting electrodes formed on a surface of a lithium tantalate substrate and in which the direction of propagation of surface acoustic waves is (40 deg to 90 deg, 40 deg to 90 deg, 0 deg to 60 deg) as expressed in Eulerian angles and within a range equivalent thereto, the surface acoustic wave filter being characterized in that the frequency difference $\Delta f$ between the resonance frequency frs of the series resonators and the resonance frequency frp of the parallel resonators is set within a range defined by the following mathematical expression, with the center frequency $f_0$, the capacitance Cos of the series resonators and the capacitance Cop of the parallel resonators taken as parameters:

$$\Delta fmin \leq \Delta f \leq \Delta fmax$$

where $\Delta f = frs - frp,$
$\Delta fmin = (-0.00158 + 0.0116P - 0.00421P^2) \times f_0,$
$\Delta fmax = (0.0778 - 0.0736P + 0.0252P^2) \times f_0,$ and
$P = Cop/Cos.$ 2. A surface acoustic wave filter which comprises surface acoustic wave resonators connected respectively in series and in parallel with a signal line and each having exciting electrodes formed on a surface of a lithium tetraborate substrate and in which the direction of propagation of surface acoustic waves is (0 deg to 50 deg, 15 deg to 75 deg, 40 deg to 90 deg) as expressed in Eulerian angles and within a range equivalent thereto, the surface acoustic wave filter being characterized in that the frequency difference $\Delta f$ between the resonance frequency frs of the series resonators and the resonance frequency frp of the parallel resonators is set within a range defined by the following mathematical expression, with the center frequency $f_0$, the capacitance Cos of the series resonators and the capacitance Cop of the parallel resonators taken as parameters:

$$\Delta fmin \leq \Delta f \leq \Delta fmax$$

where $\Delta f = frs - frp$,
$\Delta fmin = (-0.00002 + 0.00642P - 0.0021P^2) \times f_0$,
$\Delta fmax = (0.0305 - 0.0161P + 0.0021P^2) \times f_0$, and
$P = Cop/Cos$.

3. A surface acoustic wave filter which comprises surface acoustic wave resonators connected respectively in series and in parallel with a signal line and each having exciting electrodes formed on a surface of a lithium niobate substrate and in which the direction of propagation of surface acoustic waves is (40 deg to 90 deg, 40 deg to 90 deg, 0 deg to 60 deg) as expressed in Eulerian angles and within a range equivalent thereto, the surface acoustic wave filter being characterized in that the frequency difference $\Delta f$ between the resonance frequency frs of the series resonators and the resonance frequency frp of the parallel resonators is set within a range defined by the following mathematical expression, with the center frequency $f_0$, the capacitance Cos of the series resonators and the capacitance Cop of the parallel resonators taken as parameters:

$$\Delta fmin \leq \Delta f \leq \Delta fmax$$

where $\Delta f = frs - frp$,
$\Delta fmin = (0.0262 + 0.0245P - 0.0021P^2) \times f_0$,
$\Delta fmax = (0.303 - 0.269P + 0.082P^2) \times f_0$, and
$P = Cop/Cos$.

* * * * *

UNITED STATES PATENT AND TRADEMARK OFFICE
CERTIFICATE OF CORRECTION

PATENT NO.: 5,719,537
DATED     : February 17, 1998
INVENTOR(S): MATSUI et al.

It is certified that errors appear in the above-identified patent and that said Letters Patent is hereby corrected as shown below:

On the title page;

In item [75], the last inventor's address "3-1-10, Umeoka, Setagayak-ku, Tokyo, all of Japan" should be --3-1-10, Umeoka, Setagaya-ku, Tokyo, all of Japan--

Also item [73], the assignee "Sanyo Electric Co., Ltd; Yasutaka Shimizu, both of Tokyo, Japan" should be --Sanyo Electric Co., Ltd. of Osaka, Japan; and Yasutaka Shimizu of Tokyo, Japan--

Signed and Sealed this

Third Day of November, 1998

*Attest:*

BRUCE LEHMAN

*Attesting Officer*    *Commissioner of Patents and Trademarks*